(12) United States Patent
Ward, III et al.

(10) Patent No.: US 7,875,545 B2
(45) Date of Patent: Jan. 25, 2011

(54) SILICON-RICH NICKEL-SILICIDE OHMIC CONTACTS FOR SIC SEMICONDUCTOR DEVICES

(75) Inventors: Allan Ward, III, Durham, NC (US); Jason Patrick Henning, Carrboro, NC (US); Helmut Hagleitner, Zebulon, NC (US); Keith Dennis Wieber, Siler City, NC (US)

(73) Assignee: Cree, Inc., Durham, NC (US)

( * ) Notice: Subject to any disclaimer, the term of this patent is extended or adjusted under 35 U.S.C. 154(b) by 149 days.

(21) Appl. No.: 12/020,731

(22) Filed: Jan. 28, 2008

(65) Prior Publication Data

US 2008/0116464 A1 May 22, 2008

Related U.S. Application Data

(62) Division of application No. 10/884,930, filed on Jul. 6, 2004, now abandoned.

(51) Int. Cl.
*H01L 21/28* (2006.01)
*H01L 21/3205* (2006.01)
*H01L 21/44* (2006.01)

(52) U.S. Cl. .............. 438/602; 438/655; 438/660; 438/666; 438/680; 438/682; 438/931; 257/77; 257/744; 257/754; 257/766; 257/773; 257/E21.062; 257/E29.146

(58) Field of Classification Search .............. None
See application file for complete search history.

(56) References Cited

U.S. PATENT DOCUMENTS

| 5,323,022 A | 6/1994 | Glass et al. |
| 5,409,859 A | 4/1995 | Glass et al. |
| 5,442,200 A | 8/1995 | Tischler |
| 5,502,003 A | 3/1996 | Ogino et al. |

(Continued)

FOREIGN PATENT DOCUMENTS

CA 2322595 A1 4/2002

(Continued)

OTHER PUBLICATIONS

Crofton et al. The Physics of Ohmic Contacts to SiC. 1997. Phys. Stat. Sol. (b) 202, pp. 581-603.*

(Continued)

*Primary Examiner*—Hoang-Quan T Ho
(74) *Attorney, Agent, or Firm*—Withrow & Terranova, P.L.L.C.

(57) ABSTRACT

A method of producing an ohmic contact and a resulting ohmic contact structure are disclosed. The method includes the steps of forming a deposited film of nickel and silicon on a silicon carbide surface at a temperature below which either element will react with silicon carbide and in respective proportions so that the atomic fraction of silicon in the deposited film is greater than the atomic fraction of nickel, and heating the deposited film of nickel and silicon to a temperature at which nickel-silicon compounds will form with an atomic fraction of silicon greater than the atomic fraction of nickel but below the temperature at which either element will react with silicon carbide. The method can further include the step of annealing the nickel-silicon compound to a temperature higher than the heating temperature for the deposited film, and within a region of the phase diagram at which free carbon does not exist.

19 Claims, 4 Drawing Sheets

U.S. PATENT DOCUMENTS

| | | | |
|---|---|---|---|
| 5,980,265 | A | 11/1999 | Tischler |
| 6,388,272 | B1 | 5/2002 | Odekirk |
| 6,599,644 | B1 | 7/2003 | Zekentes et al. |
| 6,759,683 | B1 * | 7/2004 | Cole et al. .................... 257/77 |
| 6,815,323 | B1 * | 11/2004 | Lu et al. .................... 438/602 |
| 2004/0144301 | A1 * | 7/2004 | Neudeck et al. ............... 117/86 |
| 2005/0245034 | A1 | 11/2005 | Fukuda et al. |
| 2006/0007727 | A1 | 1/2006 | Harrison et al. |

FOREIGN PATENT DOCUMENTS

| | | | |
|---|---|---|---|
| JP | 07-099169 | * | 4/1995 |
| JP | 07099169 A | | 4/1995 |
| WO | 0184609 A1 | | 11/2001 |

OTHER PUBLICATIONS

Rastegaeva et al. The influence of temperature treatment on the formation of Ni-based Schottky dioeds and ohmic contacts to n-6H-SiC. 1997. Materials Science and Engineering B46. pp. 254-258.*

Kuimoto et al. Raman study on the Ni/SiC interface reaction. Jun. 15, 2002. Journal of Applied Physics. vol. 91, No. 12. pp. 10215-10217.*

Nakamura, et al. "NiSi2 Ohmic Contact to n-Type 4H-Sic," Materials Science Forum, vol. 389-393, 2002, pp. 889-892, Switzerland.

Nakasuka, et al, "Improvement in morphology of nickel silicide film with carbon," Junction Technology, 2002, IWJT, Extended Abstracts of the Third International Workshop Dec. 2-3, 2002, pp. 71-72.

Deeb, et al, "A low temperature route to thermodynamically stable ohmic contacts to n-type 6H-Sic," Applied Phyics Letters, American Institute of Physics, vol. 84, No. 7, Feb. 16, 2004, pp. 1117-1119.

Cole, et al., Enhanced Performance and Reliability of SiC High Power Switch Components: An Enableing (sic) Technology for Electric Weapons and Propulsion Systems; 23rd Army Science Conference: Dec. 2-5, 2002: 8 pages.

Du, et al.; Experimental Investigations and Thermodynamic Descriptions of the Ni-Si and C-Ni-Si Systems ; Metallurgical and Materials Transactions A; Sep. 1999; pp. 2409-2418; vol. 30A.

Bachli, et al.; Nickel Film on (001) SiC: Thermally Induced Reactions; Materials Science and Engineering B56 (1998) pp. 11-23.

Zetterline (editor); Process Technology for Silicon Carbide Devices (EMIS processing series; No. 2); 2002, pp. 134-135; INSPEC, The Institution of Electrical Engineers, London.

Non-Final Rejection mailed Apr. 7, 2001.
Final Rejection mailed Nov. 2, 1006.
Final Rejection mailed Apr. 13, 2007.
Examiner's Answer mailed May 14, 2008.
Board of Patent Appeals and Interferences mailed Jun. 19, 2009.

* cited by examiner

SILICON-RICH NICKEL-SILICIDE OHMIC CONTACTS FOR SIC SEMICONDUCTOR DEVICES

RELATED APPLICATIONS

This is a divisional application of Ser. No. 10/884,930 filed Jul. 6, 2004.

This invention was developed under Government Contract No. N00014-02-C-0250 sponsored by the Office of Naval Research. The Government may have certain rights in this invention.

BACKGROUND

The present invention relates to semiconductor devices formed in silicon carbide (SiC) and in particular relates to an improved ohmic contact to silicon carbide and a method of forming the improved ohmic contact.

As compared with silicon and other more common semiconductor materials, silicon carbide substrate has several advantages for semiconductor purposes. These include a wide band gap, high saturation drift velocity, high thermal conduction and high breakdown voltage. Silicon carbide is also "radiation hard," is physically extremely strong, and remains stable at very high temperatures. These properties make silicon carbide particularly suitable for power semiconductor devices.

As is well recognized, ohmic contacts are a fundamental design element in almost all semiconductor devices. The purpose of an ohmic contact is to provide an unimpeded flow of current to a semiconductor material when a bias (voltage) is applied to the contact. An ohmic contact is an interface which has a linear and symmetric current voltage relationship within the limits of its intended use (and which may be represented by constant resistance). The term ohmic contact will be used in its conventionally understood sense herein.

Conventional ohmic contacts to SiC are typically formed from metal-silicide compositions, with nickel-silicide being a common and desired choice. Generally speaking, ohmic contacts formed from metals that react well with silicon have been observed to form favorable ohmic contacts to silicon carbide. These metals include Ni, Co, W, Ta, Ti, Cr, Mo, and Zr. Nevertheless, silicides tend to produce, "complicated metallurgy at the interface" (U.S. Pat. No. 5,442,200 at Column 3 line 64-65). The '200 patent describes the use of a sacrificial silicon layer as the stoichiometric limiting element between a silicon carbide surface and the contact metal, followed by a relatively high temperature (900-1050° C.) anneal to produce ohmic character.

Other researchers have tried stoichiometric NiSi, but with success only on 6H SiC and not on 4H SiC, Deeb et al, *A Low Temperature Route To Thermodynamically Stable Ohmic Contacts To n-type 6H-SiC*, Appl. Phys. Lett., Vol. 84, No. 7 (2004), pages 1117-19. Yet others have attempted stoichiometric $NiSi_2$ followed by a high temperature anneal, Nakamura et al, $NiSi_2$ *Ohmic Contact to n-type 4H-SiC*, Materials Science Forum, Vols. 389-393 (2002), pages 889-92.

Furthermore, present nickel-silicide contacts tend to require processing ("annealing") temperatures above 800° C. (with temperatures up to 1050° C. sometimes preferred) before demonstrating ohmic character. These annealing temperatures generally cause void space within the contact, carbon regions within and adjacent the contact, undesired combinations of nickel and silicon, broaden the metal-SiC interface, and roughen the interface morphology.

In turn, these problems lead to surface roughness, diffusion paths in and around the contact, and potential delamination of the contact from the silicon carbide. These items cause problems in conforming any subsequently deposited layers and also tend to more easily encourage undesired chemical reactions between the device and its ambient surroundings, typically reactions with the atmosphere (oxygen), or with moisture. These potential problems can, of course, be exacerbated by the high temperature and environmentally challenging circumstances that make silicon carbide an attractive candidate material in the first place.

Indeed, some researchers point out that when SiC-based devices are used or tested under more extreme operating conditions, the deterioration of their ohmic contacts (rather than of the SiC) becomes the limiting factor, with contact degradation and wire bond failure being exemplary. Cole, et al, Enhanced Performance And Reliability Of Sic High Power Switch Components: An Enabling Technology For Electric Weapons And Propulsion Systems, 23d Army Science Conference, Dec. 2-5, 2002. As stated therein, in SiC-based devices, ohmic contacts should be, "thermally stable, compositionally inert, mechanically robust (and exhibit) low resistance."

SUMMARY

In one aspect, the invention is a method of producing an ohmic contact to silicon carbide comprising forming a deposited film of nickel and silicon on a silicon carbide surface at a temperature below which either element will react with silicon carbide and in respective proportions so that the atomic fraction of silicon in the deposited film is greater than the atomic fraction of nickel, and heating the deposited film of nickel and silicon in a low temperature heat treatment at a temperature at which nickel-silicon compounds will form with an atomic fraction of silicon greater than the atomic fraction of nickel but below the temperature at which either element will react with silicon carbide. As an additional advantage, the ohmic characteristics of the resulting contact can be enhanced by carrying out a high-temperature annealing step.

In another aspect, the invention is a deposited film of silicon and nickel comprising a layer of nickel and a layer of silicon on a silicon carbide surface in which the ratio of the silicon film thickness to the nickel film thickness is between about 1.81 and 3.65.

In yet another aspect, the invention is a semiconductor structure comprising a layer of silicon carbide and a contact on the silicon carbide layer that demonstrates ohmic character, the contact being formed of a composition having the formula $Ni_{1-x}Si_x$ where $0.5 < x < 0.67$.

In yet another aspect, the invention is a semiconductor device that incorporates the ohmic contact structure with a metallization layer on the ohmic contact.

The foregoing and other objects and advantages of the invention and the manner in which the same are accomplished will become clearer based on the followed detailed description taken in conjunction with the accompanying drawings.

DETAILED DESCRIPTION

The present invention is a method of producing an ohmic contact to silicon carbide that addresses and improves upon prior techniques. The method comprises depositing a film of nickel and silicon on a silicon carbide surface at a temperature below which either element (nickel or silicon) will react with silicon carbide, and with the nickel and silicon being present in respective proportions so that the atomic fraction of silicon in the deposited film is greater than the atomic fraction of nickel. Such a composition can be referred to as being "silicon-rich." The method then comprises heating the deposited film of nickel and silicon at a temperature at which nickel-silicon ("nickel silicide") compounds will form with an atomic fraction of silicon greater than the atomic fraction of nickel, but below the temperature at which either element will react with silicon carbide.

As an additional advantage, the ohmic characteristics of the resulting contact can be enhanced by carrying out a second, higher-temperature annealing step as described more fully hereinafter.

Figure 1:
FIGS. 1 and 2 are scanning tunneling electron microscope (STEM) cross-sectional photographs of ohmic contacts according to the present invention.
Figure 2:
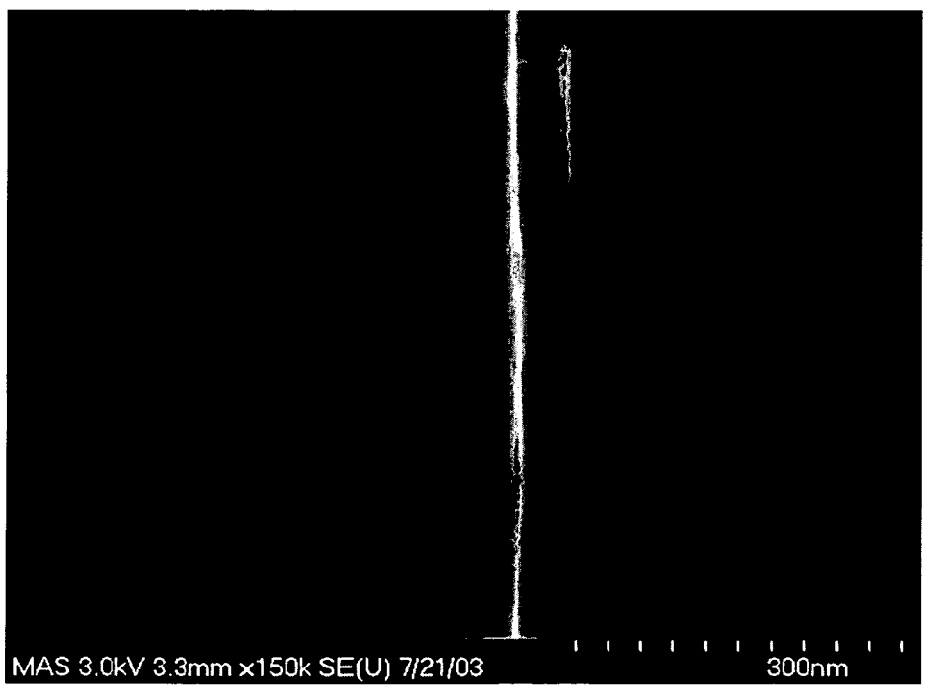

FIGS. 1 and 2 are STEM photographs of ohmic contacts according to the present invention. The contacts are oriented vertically in FIGS. 1 and 2. From left to right, the first dark region is empty space, the bright "layer" is the surface of the nickel-silicide (the sample is tilted slightly toward the viewer), the next layer is the bulk of the nickel-silicide (within this layer there are small spheres which represent $NiSi_2$ agglomeration), next there is a very thin almost black interface between the nickel-silicide film and the SiC surface, and the large field remaining to the right is the SiC substrate.

The term "nickel silicide" is used herein in a broad sense to identify any compound or composition formed of nickel and silicon and is not limited to the stoichiometric combinations of NiSi or $NiSi_2$.

Figure 3:
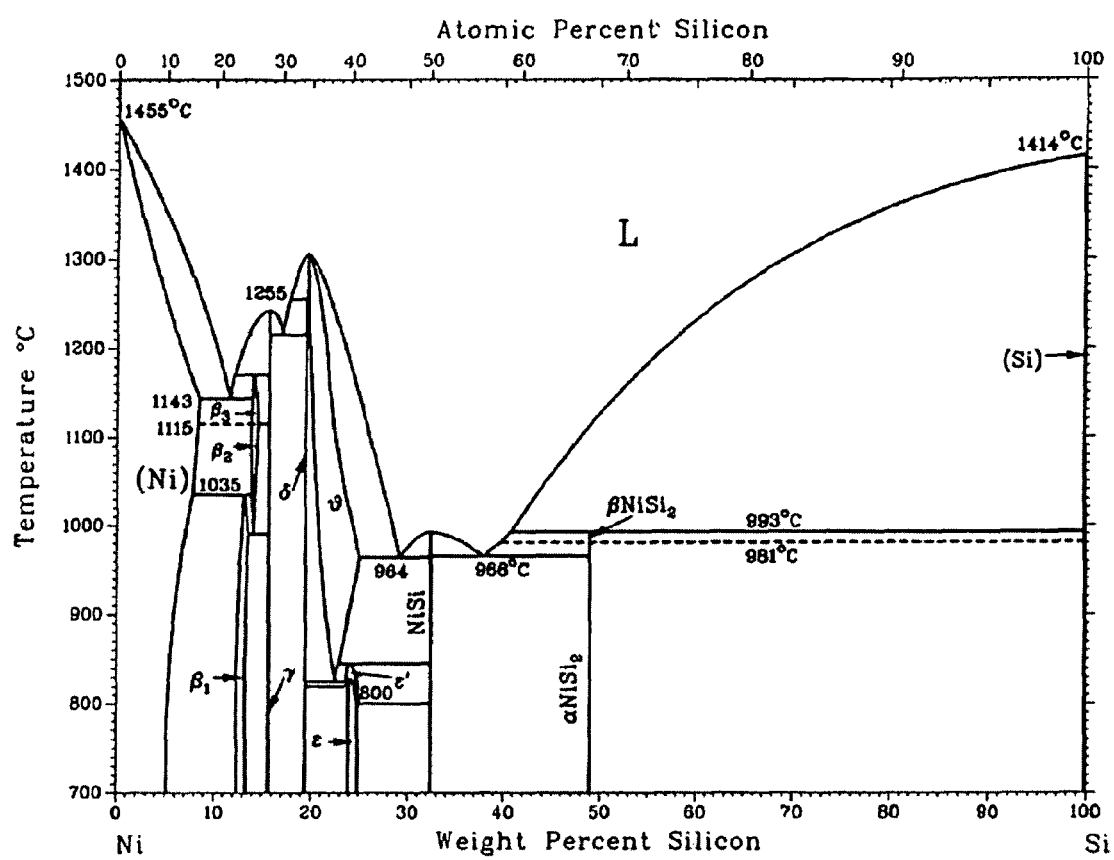
FIG. 3 is a phase diagram for the nickel and silicon system over the temperature range of 700° to 1500° C.

The invention takes advantage of several of the characteristics of nickel, silicon and nickel-silicon compounds which are illustrated by the phase diagram included herein as FIG. 3. In considering FIG. 3, it will be understood that the characteristics of the phase diagram below 700° C. are for the most part identical to those at 700° C. Stated differently, because the phases of the nickel-silicon system are identical between 0 and 700° C., the composition and phases of the nickel-silicon system below 700° C. can be understood by referring to the 700° C. line in FIG. 3.

Thus, as FIG. 3 illustrates, the atomic percentage of silicon (atomic weight=28.1) will be greater than 50% when the weight percentage is greater than about 32% (the atomic weight of nickel being 58.7). Similarly, starting at an atomic percentage of silicon of about 67% (properly understood as two silicon atoms per nickel atom), the elements will form the compound $NiSi_2$. This compound is silicon-rich but does not necessarily form low resistance ohmic contacts to the 4H or 6H polytypes of silicon carbide.

Similarly, compositions of nickel and silicon that are below 50 atomic percent silicon will form ohmic contacts, but lead to the problems set forth in the Background.

Accordingly, in preferred embodiments the invention comprises forming the deposited film with an atomic fraction of silicon that is greater than 50 atomic percent and less than about 67 atomic percent and then heating the deposited film in a low temperature heating step to form a nickel silicon compound with an atomic fraction of silicon that is greater than 50 atomic percent and no more than about 67 atomic percent.

The preferred heating temperatures for the low temperature step are between about 200 and 500° C. At temperatures above about 500° C., nickel or silicon or both will begin to react with silicon carbide. As explained above, the invention seeks to avoid the resulting problems. Similarly, although there is no theoretical lower limit to the heating temperature, the reaction proceeds very slowly below about 200° C., and thus this forms a practical lower limit for useful production purposes.

In its preferred embodiment, the method further comprises the step of annealing the nickel-silicon deposit to a temperature higher than the heating temperature for the deposited film and within a region of the phase diagram at which free carbon does not exist. In general, higher temperatures produce lower resistance contacts. Thus, in preferred embodiments, the annealing temperature is as high as possible, but typically about 850° C., because the inventors have observed that a potentially previously unobserved and undesirable phase change occurs beginning at about 875° C. and because the resources available do not offer small increments of temperature control or measurement at these temperatures.

In order to distinguish between the two steps described herein, the step of forming the deposited film will be referred to as the "heating" step and represents a lower temperature heat treatment. The step of annealing the compound will be referred to as the "annealing" step and represents a higher temperature process. The difference between the steps will also be evident from the context.

Figure 4:
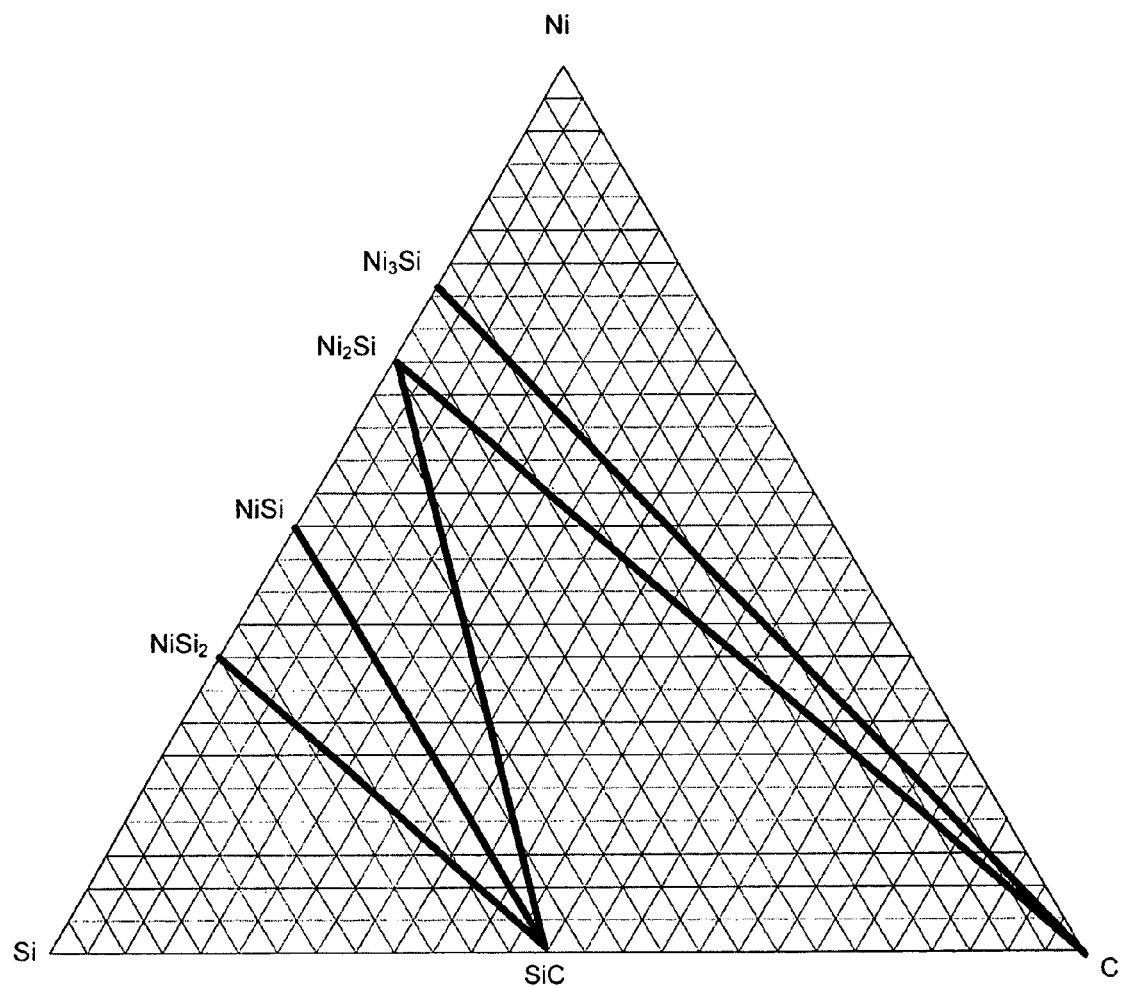
FIG. 4 is the ternary phase diagram for the nickel (Ni), silicon (Si), and carbon (C) system at a temperature of 850° C.

The purpose of incorporating the silicon-rich deposit is further illustrated by FIG. 4, which is the ternary phase diagram for the silicon-nickel-carbon system at 850° C.

As understood by those familiar with ternary phase diagrams, each labeled apex represents a 100% composition of that element. The lines crossing through the triangle are referred to as "tie lines" and these define proportions in which two phases coexist having the compositions labeled at the ends of the tie lines. No other compositions or compounds appear along those tie lines. In another consideration, the tie lines within the overall diagram also define individual ternary phase diagrams. Thus, the lower left-hand triangle defined by silicon, $NiSi_2$ and SiC defines a region in which one or more of these three compositions can exist, but within which neither free nickel nor free carbon can exist. This is also true of the triangle defined by $NiSi_2$, NiSi and SiC.

The absence of free carbon in the silicon-rich areas of FIG. 4 represents a particular advantage of the invention. Specifically, it will be seen that in all of the situations within the Ni—Si—C system (again, at 850° C.) where silicon has a higher atomic percentage than nickel, free carbon is absent. Thus, because the first step in the method of the invention is to form a composition that is silicon-rich, annealing such a silicon-rich composition at 850° will preclude the presence of carbon. By eliminating carbon, the invention eliminates a number of the carbon-based or carbon-related problems (e.g. voiding) associated with more conventional metal-silicide contacts on silicon carbide.

The method of the invention is applicable to a number of useful permutations. The method can include the step of doping the silicon carbide to be p-type or n-type in an amount sufficient to help lower the resistance. Higher doping concentrations favorably lower the contact's resistance and concentrations of about $10^{19}$ per cubic centimeter ($cm^{-3}$) are presently preferred prior to the step of depositing the nickel and the silicon and thereafter depositing the nickel and silicon on the silicon carbide surface.

The step of adding the nickel and silicon to form the deposited film can be carried out several ways. In one technique, the step comprises depositing a layer of nickel and a layer of silicon in respective proportional thicknesses that, based upon the density of the materials, produce the greater atomic fraction of silicon that is desired in the deposited film. In preferred embodiments, this will be a ratio of silicon layer thickness to nickel layer thickness of between about 1.81 to 1 and 3.65 to 1.

In a similar manner, the step of forming the deposited film can comprise depositing a plurality of nickel layers and a plurality of silicon layers in respective proportional thicknesses that in total produce the greater atomic fraction of silicon in the deposited film. In such circumstances, the ratio of the total thickness of silicon layers to the total thickness of nickel layers should again be between about 1.81:1 and 3.65:1.

In each of these methods, the silicon layer is preferably added first to the silicon carbide surface after which the nickel layer is applied to the silicon layer.

In yet another alternative, the deposited film can be formed by sputter depositing the nickel-silicon layer in the desired proportion of nickel and silicon on the silicon carbide surface.

The ohmic contact is most commonly formed to bulk single crystals of silicon carbide or to epitaxial layers of silicon carbide, but can be added to any other appropriate silicon carbide surface. Similarly, the nature of the nickel-silicon system is that it is preferred for use with silicon carbide having either the 4H or 6H polytype. Examples of contacts to 4H SiC are set forth in the Experimental section herein.

In another embodiment, the invention is a deposited film that comprises a layer of nickel and a layer of silicon on a silicon carbide surface in which the ratio of the silicon film thickness to the nickel film thickness is between about 1.81:1 and 3.65:1. In turn, this embodiment can also comprise a plurality of layers of silicon and a plurality of layers of nickel (including alternating layers) in which the ratio of the total thickness of the silicon film layers to the total thickness of the nickel film layers is between about 1.81:1 and 3.65:1.

Figure 5:
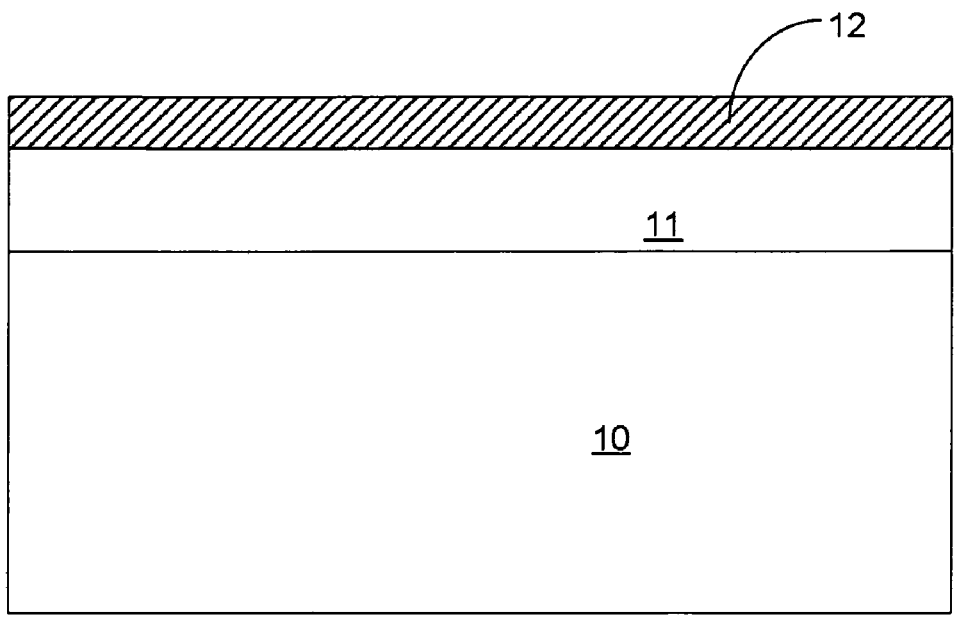
FIG. 5 is a schematic cross-sectional view of a pre-contact structure according to the present invention.

FIG. 5 is a schematic illustration (not to scale) of the deposited film, including the SiC 10, a silicon layer 11, and a nickel layer 12.

As in the method embodiments, the deposit can be made to a doped silicon carbide surface and the silicon layer is preferably on the silicon carbide surface with the nickel layer on the silicon layer. In this structural embodiment, the silicon carbide surface can comprise an epitaxial layer or a bulk single crystal and likewise is preferably selected from the group consisting of the 4H and 6H polytypes of silicon carbide.

In yet another aspect, the invention is a semiconductor structure comprising a layer of silicon carbide and a contact on the silicon carbide layer that demonstrates ohmic character, with the contact being formed of a composition having the formula $Ni_{1-x}Si_x$ where $0.5<x<0.67$. In preferred embodiments, the contact has the formula $Ni_{0.48}Si_{0.52}$.

Figure 6:
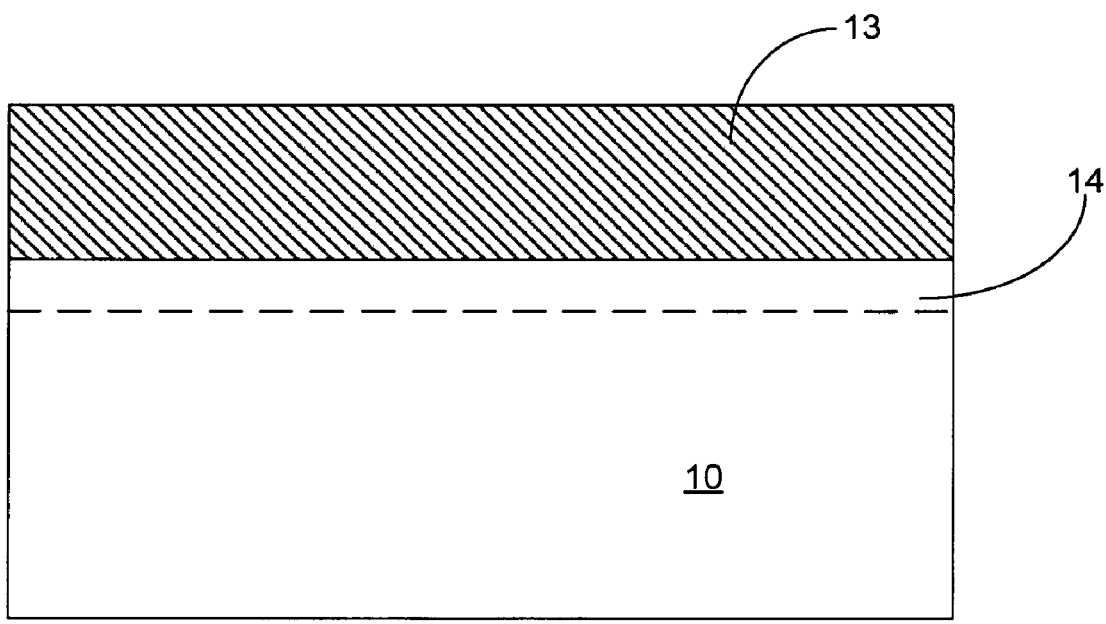
FIG. 6 is a schematic cross-sectional view of an ohmic contact structure according to the present invention.

FIG. 6 illustrates this embodiment (again, not to scale) with the silicon carbide 10, the ohmic contact 13, and an interaction zone 14 in the SiC 10 adjacent the ohmic contact 13. The interaction zone 14 represents a region with a preponderance of the nickel-silicon composition, thus minimizing or eliminating graphite formation.

In this embodiment, the ohmic contact is again preferably made to silicon carbide with either the 4H or 6H polytypes and is most typically made to an epitaxial layer or a bulk single crystal of silicon carbide. As set forth above and as described further in the Experimental section, the invention produces ohmic characteristics for p-type and n-type silicon carbide.

In turn, and in yet another aspect, the invention can thus comprise a semiconductor device that includes the ohmic contact described herein, typically with a metallization connection to the ohmic contact. As used herein (which is consistent with this art), the term "metallization" refers to the methods and resulting structures for connecting the ohmic contact, and thus the device, to other devices and circuits. Representative aspect of metallization are well understood in this art and are discussed in Zetterling, PROCESS TECHNOLOGY FOR SILICON CARBIDE DEVICES, 2002 INSPEC at pages 134-35.

Because ohmic contacts are almost ubiquitous in semiconductor devices, a list of such devices would merely obscure the invention rather than highlight it, and thus it will be understood by those of skill in this art that whenever an ohmic contact is made to silicon carbide, the invention provides advantages for such purpose.

Experimental

The region of the intended ohmic contact is first prepared by doping the silicon carbide material as either p or n type, preferably to a carrier concentration of at least about $1\times10^{15}$ $cm^{-3}$ with $10^{19}$ $cm^{-3}$ being more preferred as noted above. The intended ohmic contact region may be patterned using standard photolithographic techniques. A thin film of silicon is then deposited in any morphology onto the surface of the implanted region. A thin film of nickel is then deposited onto the silicon film such that the ratio of the silicon film thickness to the nickel film thickness is between about 1.81:1 and 3.65:1. After an initial heating (the low temperature heat treatment of 200 to 500° C.), this film thickness ratio range will form a film having an atomic fraction of silicon in the resulting homogeneous film of between about 0.50 and 0.67, with 0.52 being preferred. As noted elsewhere, this atomic ratio may also be obtained by a sputter deposition technique or any other PVD or CVD technique that does not otherwise adversely affect the resulting contact.

The temperature range of between about 200 and 500° C. is high enough to provide significant diffusion between the silicon and the nickel films, but below temperatures at which any significant reaction occurs between the nickel or the silicon and the silicon carbide surface.

According to the nickel-silicon binary phase diagram (FIG. 3) a silicon-rich nickel silicide compound should result from the reaction between the silicon and nickel thin films under these conditions. This silicon-rich nickel silicide film exhibits ohmic behavior on doped silicon carbide surfaces. The typical resistivity of the resulting ohmic contact is on the order of $10^{-3}$ ohm-cm$^2$ for p-type contacts and on the order of $10^{-5}$ ohm-cm$^2$ for n-type contacts, which is expected to be suitable for a number of present and future electronic applications and thus requiring no further processing of the contact other than deposition of a metallic interconnect to the metal of the intended semiconductor device.

Lower Resistivity Contact

A lower resistivity ($10^{-6}$ ohm-cm$^2$) ohmic contact can be formed by further processing the ohmic contact prior to interconnect deposition. According to the nickel-silicon-carbon phase diagram at 850° C. (FIG. 4), no equilibrium phase of carbon can exist in the silicon-rich phase field. Thus, by reacting the silicon-rich nickel silicide film with the silicon carbide substrate at or near 850° C. (the high temperature anneal), equilibrium carbon phases (such as graphite) should be precluded thereby improving the morphological consistency of the silicide contact. As note above FIG. 6 is a schematic diagram illustrating a preponderance of the nickel silicon phase in the interaction zone 14 for low resistance ohmic properties with an excess of silicon to minimize graphite formation. The inventors have determined that this behavior is exhibited when the annealing step is carried out over a temperature range of 500 to 900° C., with contact resistance decreasing generally continuously as annealing temperature increases.

As an additional advantage, and because of the stoichiometrically excess silicon, the tendency for nickel to accumulate is avoided, thus further improving the morphological consistency of the intended silicide contact. The resulting contact is relatively smooth compared to those formed from more traditional methods, and thus allows better conformation of subsequently deposited layers of materials during device fabrication. This in turn leads to an improved electric field breakdown resistance, improved device quality, improved device reliability, and higher fabrication yield. Because ohmic contacts are an integral part of the vast majority of semiconductor devices, the invention is widely applicable to almost every electronic device that requires an ohmic contact between mental and silicon carbide epitaxial or bulk material.

A silicon-rich nickel silicide ohmic contact according to the invention on 4H SiC n-type material exhibited a specific contact resistance of $3.4 \times 10^{-6}$ ohm-cm$^2$ with a standard deviation of $1.4 \times 10^{-7}$ and an "R-squared" fit to the transmission line model (TLM) of 0.99999.

A silicon-rich nickel silicide ohmic contact according to the invention on 4H SiC p-type material exhibited a specific contact resistance of $2.4 \times 10^{-3}$ ohm-cm$^2$ with a standard deviation of $1.0 \times 10^{-4}$ and an "R-squared" fit to the TLM model of 0.99985.

Thus, the contact to the p-type material is somewhat more resistive than the contact to the n-type materials, but is useful in applications that require ohmic behavior, but not necessarily low contact resistance.

In the drawings and specification there have been set forth preferred embodiments of the invention, and although specific terms have been employed, they are used in a generic and descriptive sense only and not for purposes of limitation, the scope of the invention being defined in the claims.

The invention claimed is:

1. A method of producing an ohmic contact to silicon carbide comprising:
    providing a film of nickel and silicon on a silicon carbide surface in respective proportions so that the atomic fraction of silicon in the film is greater than the atomic fraction of nickel;
    heating the film of nickel and silicon at a temperature between about 200 and 500° C. to form a nickel-silicon compound; and
    annealing the nickel-silicon compound to a temperature higher than the heating temperature for the film, and within a region of a phase diagram at which free carbon does not exist.

2. A method according to claim 1 comprising:
    forming the film with an atomic fraction of silicon that is greater than 0.50 and no more than about 0.67; and
    heating the film to form a nickel-silicon compound with an atomic fraction of silicon that is greater than 0.50 and no more than about 0.67.

3. A method according to claim 1 wherein the step of heating the film comprises heating the film to form a compound having the formula $Ni_{1-x}Si_x$ where $0.5 < x < 0.67$.

4. A method according to claim 1 comprising depositing the film on the silicon carbide surface.

5. A method according to claim 1 comprising annealing the nickel-silicon compound to a temperature of between about 500 and 850° C.

6. A method according to claim 4 comprising doping the silicon carbide to a concentration of about $10^{19}$ cm$^{-3}$ prior to the step of depositing the nickel and the silicon.

7. A method according to claim 1 wherein the step of providing the film comprises depositing a plurality of nickel layers and a plurality of silicon layers in respective proportional thicknesses to produce the greater atomic fraction of silicon in the deposited film.

8. A method according to claim 7 comprising depositing the respective nickel and silicon layers in a ratio of total thickness of silicon to total thickness of nickel of between about 1.81 and 3.65.

9. A method according to claim 7 comprising depositing the silicon layer on the silicon carbide surface and thereafter depositing the nickel layer on the silicon layer.

10. A method according to claim 1 wherein the step of providing the film comprises sputter depositing a nickel-silicon layer in the desired proportion of nickel and silicon on the silicon carbide surface.

11. A method according to claim 10 comprising forming the deposited film on a doped silicon carbide surface.

12. A method according to claim 1 comprising providing the film on a silicon carbide surface selected from the group consisting of bulk single crystals of silicon carbide and epitaxial layers of silicon carbide.

13. A method according to claim 1 comprising providing the film on a silicon carbide surface having a polytype selected from the group consisting of the 4H and 6H polytypes of silicon carbide.

14. A method of producing an ohmic contact to silicon carbide comprising:
    depositing a layer of nickel and a layer of silicon in respective proportional thicknesses on a silicon carbide surface so that the atomic fraction of silicon in the deposited layers is greater than the atomic fraction of nickel in the deposited layers;
    depositing the layers of nickel and silicon at a temperature below which either element will react with silicon carbide; and
    thereafter heating the deposited layers of nickel and silicon to a temperature at which nickel-silicon compounds will form with an atomic fraction of silicon greater than the atomic fraction of nickel but below the temperature at which either element will react with silicon carbide.

15. A method according to claim 14 comprising annealing the nickel-silicon compound to a temperature of between about 500 and 850° C.

16. A method according to claim 14 comprising depositing the nickel and silicon in a ratio of silicon layer thickness to nickel layer thickness of between about 1.81 and 3.65.

17. A method according to claim 14 comprising depositing the silicon layer on the silicon carbide surface and thereafter depositing the nickel layer on the silicon layer.

18. A method of producing an ohmic contact to silicon carbide comprising:
    providing a film of nickel and silicon on a silicon carbide surface in respective proportions so that the atomic fraction of silicon in the film is greater than the atomic fraction of nickel;
    heating the film at a temperature below 500° C.; and
    thereafter annealing the film at a temperature of between 500 and 900° C.

19. A method according to claim 18 wherein the step of providing the nickel and silicon film comprises forming the film with an atomic fraction of silicon that is greater than 0.50 and no more than about 0.67.

* * * * *